United States Patent
Tang et al.

(10) Patent No.: US 8,351,279 B2
(45) Date of Patent: Jan. 8, 2013

(54) SRAM BITCELL DATA RETENTION CONTROL FOR LEAKAGE OPTIMIZATION

(75) Inventors: Yukit Tang, Sunnyvale, CA (US); Kuoyuan Hsu, San Jose, CA (US)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 215 days.

(21) Appl. No.: 12/846,129

(22) Filed: Jul. 29, 2010

(65) Prior Publication Data

US 2012/0026805 A1    Feb. 2, 2012

(51) Int. Cl.
   *G11C 7/06* (2006.01)
(52) U.S. Cl. ............... 365/189.07; 365/226; 365/189.11
(58) Field of Classification Search ............. 365/189.07, 365/226, 189.11, 154, 189.12, 189.09, 230.06, 365/156, 227

See application file for complete search history.

(56) References Cited

U.S. PATENT DOCUMENTS

| | | | |
|---|---|---|---|
| 8,085,579 B2 * | 12/2011 | Inoue | 365/154 |
| 2009/0285046 A1 * | 11/2009 | Ehrenreich et al. | 365/227 |
| 2009/0296497 A1 * | 12/2009 | Hirabayashi | 365/189.09 |

* cited by examiner

*Primary Examiner* — Dang Nguyen
(74) *Attorney, Agent, or Firm* — Duane Morris LLP (57) ABSTRACT

An integrated circuit includes a static random access memory (SRAM) array coupled to a first voltage supply node and a second voltage supply node. The first and second voltage supply nodes provide a retention voltage across the SRAM array. A current limiter is disposed between the SRAM array and the first voltage supply node, and a voltage regulator is coupled in parallel with the current limiter between the SRAM array and the first voltage supply node. The voltage regulator is configured to maintain the retention voltage across the SRAM array above a predetermined level.

19 Claims, 10 Drawing Sheets

SRAM BITCELL DATA RETENTION CONTROL FOR LEAKAGE OPTIMIZATION

FIELD OF DISCLOSURE

The disclosed method relates to integrated circuits. More specifically, the disclosed method relates to static random access memory (SRAM) circuits formed on a semiconductor substrate.

BACKGROUND

Semiconductor memory devices are continually being designed to be made smaller, faster, and to require less power such that they may be incorporated in portable devices that run on battery power. SRAM is volatile memory widely used in laptop computers and personal digital assistants (PDAs) in which each memory cell includes a transistor-based bi-stable latch that is either in an 'on' state or an 'off' state. SRAM devices may include a matrix of thousands of individual memory cells fabricated on an integrated circuit (IC) chip.

Conventional SRAM arrays have high power consumption due to current leakage when the SRAM array is in a normal operation condition in which data is not being read from or written to the SRAM array. To reduce the leakage current and power consumption of SRAM arrays, a self biased diode is often coupled between low voltage supply $V_{SS}$ and the SRAM array. However, self-biasing diodes experience significant variations across process, voltage, and temperature ("PVT"), which causes problems with data retention and leakage optimization.

For example, when self-biasing diode is in an off state in which current does not flow through the diode, charge accumulates at the node between the diode and the SRAM array thereby increasing the voltage at the node, which reduces the voltage drop across the SRAM array, i.e., the retention voltage. The reduction in the retention voltage is exacerbated by variations in the threshold voltage of the self-biasing diode across PVT variations.

Accordingly, an improved SRAM design is desirable.

SUMMARY

In some embodiments, a static random access memory (SRAM) array is coupled to a first voltage supply node and a second voltage supply node. The first and second voltage supply nodes provide a retention voltage across the SRAM array. A current limiter is disposed between the SRAM array and the first voltage supply node, and a voltage regulator is coupled in parallel with the current limiter between the SRAM array and the first voltage supply node. The voltage regulator is configured to maintain the retention voltage across the SRAM array above a predetermined level.

In some embodiments, an integrated circuit includes an SRAM array, a current limiter, and a voltage regulator. The SRAM array is disposed between a first voltage supply node and a second voltage supply node that provide a retention voltage across the SRAM array. The current limiter includes a first MOS transistor disposed between the SRAM array and the first voltage supply node. The voltage regulator is coupled in parallel with the current limiter between the SRAM array and the first voltage supply node. The voltage regulator includes an operational amplifier and a second MOS transistor. The operational amplifier has a first input coupled to a node between the SRAM array and the current limiter, a second input is configured to receive a reference voltage, and an output is coupled to the gate of the second MOS transistor. The voltage regulator applies a switching voltage to the gate of the second MOS transistor based on a difference between a voltage of the node and a reference voltage to maintain the retention voltage across the SRAM array above a predetermined level.

In some embodiments, a voltage of a node disposed between an SRAM array and a current limiter is sensed and compared to a reference voltage. Current from the node is sunk if the sensed voltage is above the reference voltage to maintain a retention voltage across the SRAM array above a predetermined level.

DETAILED DESCRIPTION

Figure 1A:
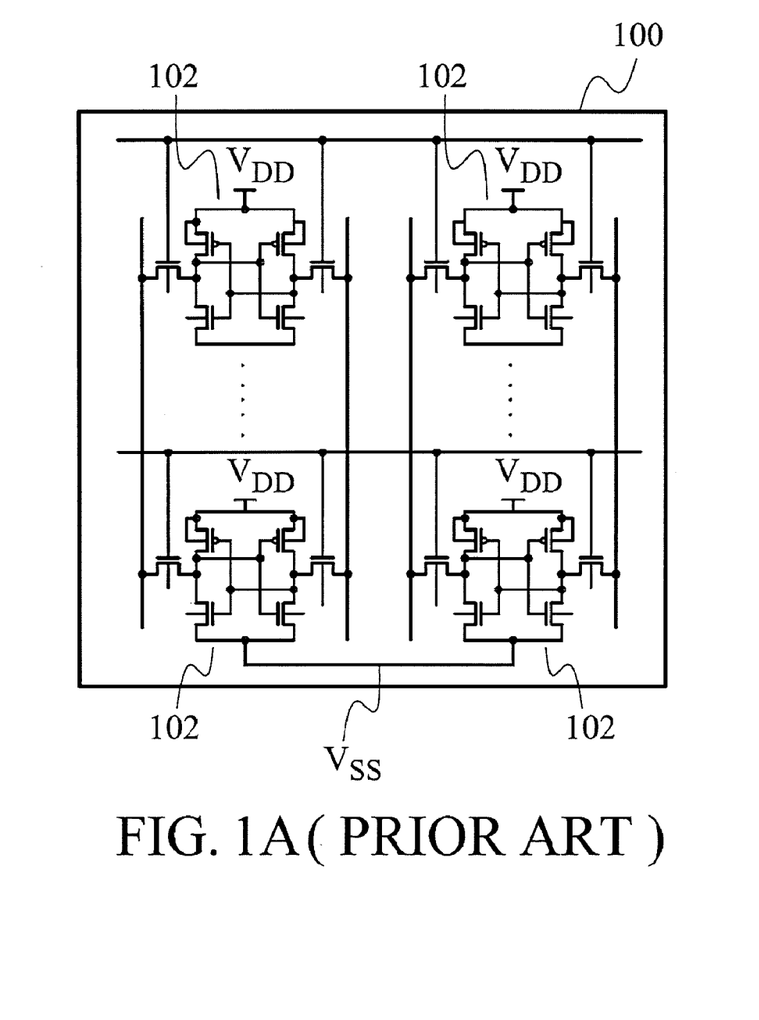
FIG. 1A is a schematic diagram of an example of an SRAM array.
Figure 1B:
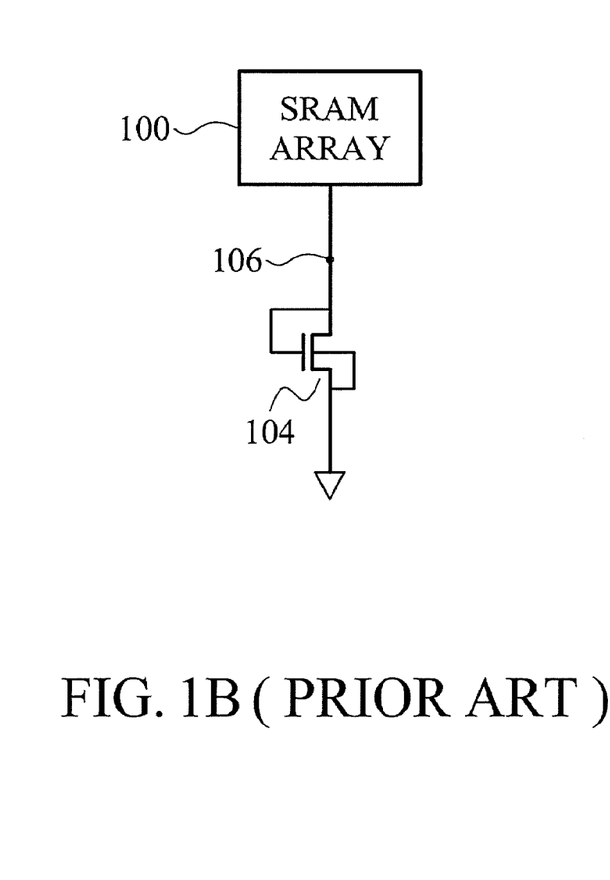
FIG. 1B is a schematic diagram of a conventional circuit for reducing leakage current in an SRAM array.

FIG. 1A illustrates an example of an SRAM array 100 including a plurality of SRAM cells 102. As shown in FIG. 1A, the SRAM cells are coupled to a positive voltage supply $V_{DD}$ and to a low or negative voltage supply $V_{SS}$, which may be set at ground. However, these conventional arrays have high power consumption due to current leakage when SRAM array 100 is in a normal operation condition in which data is not being read from or written to SRAM array 100. To reduce the leakage current and power consumption of SRAM arrays, a self biased diode 104 is often coupled between low voltage supply $V_{SS}$ and SRAM array 100 as illustrated in FIG. 1B. However, self-biasing MOS diodes experience significant variations across process, voltage, and temperature ("PVT"), which causes problems with data retention and leakage optimization.

Figure 1C:
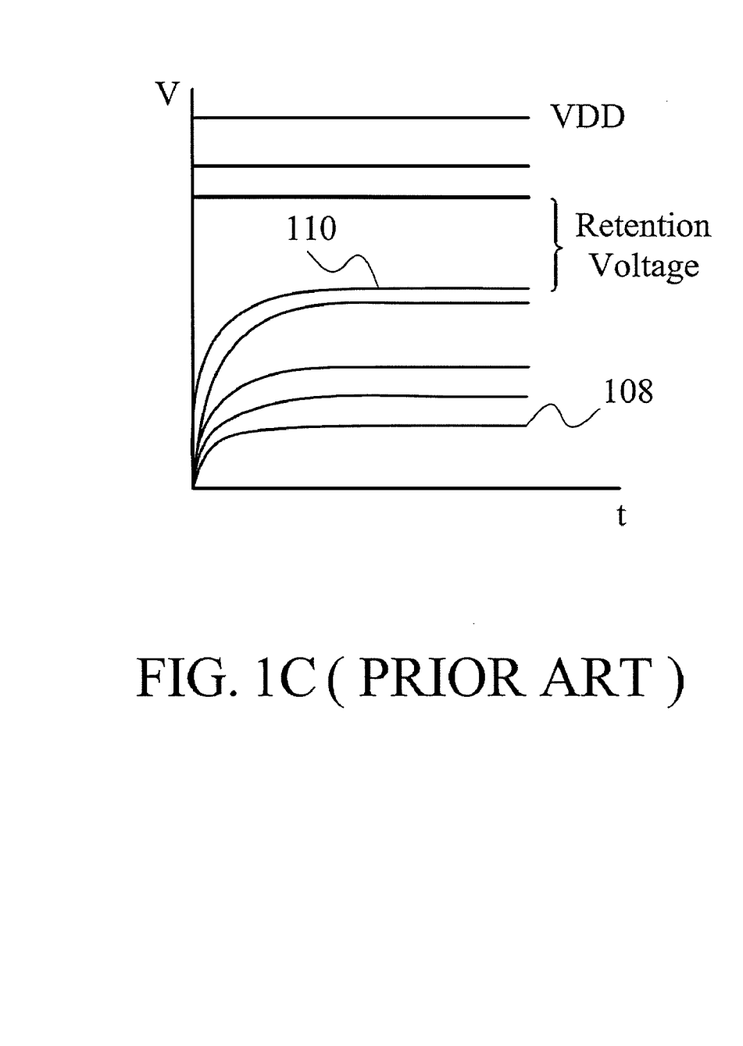
FIG. 1C is a voltage versus time graph illustrating the voltage across the NMOS transistor in FIG. 1B.
Figure 1D:
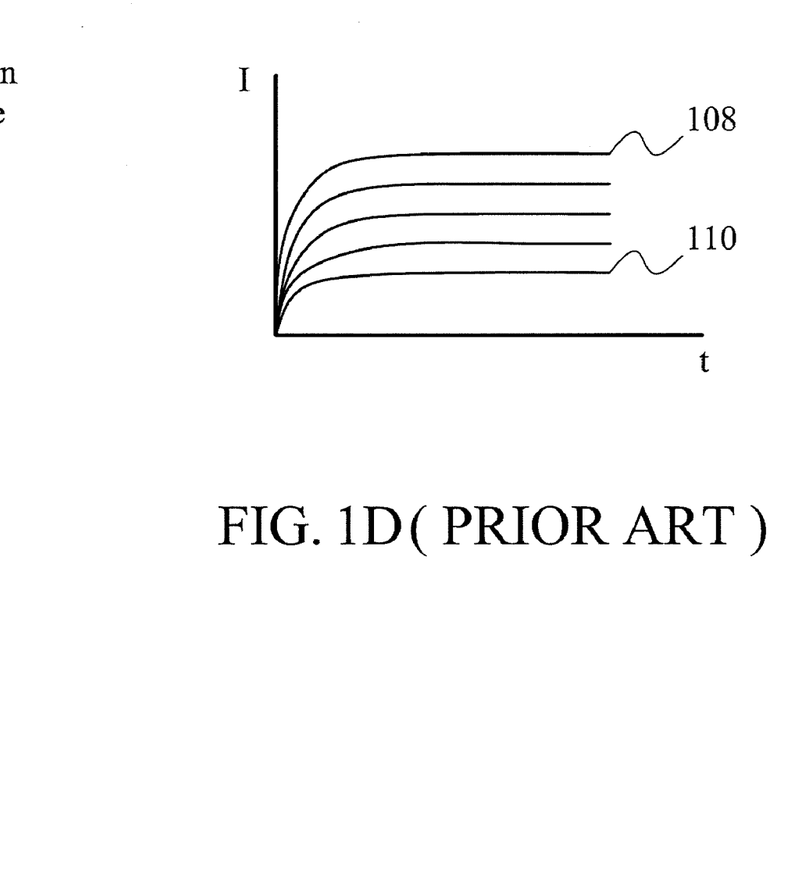
FIG. 1D is a current versus time graph illustrating the current through the NMOS transistor in FIG. 1B.

For example, when self-biasing diode 104 is in an off state in which current does not flow through diode 104, charge accumulates at node 106 increasing the voltage $V_{GND}$ at node 106. As the current through diode 104 increases, the voltage of $V_{GND}$ decreases. A high voltage at node 106 reduces the voltage difference across SRAM array 100, which is referred to as the retention voltage. For example, FIGS. 1C and 1D respectively illustrate the voltage versus time and current versus time for a self-biased diode 104. As shown in FIGS. 1C and 1D, the retention voltage is greatest when the current through diode 104 is at its maximum (trace 108 in FIGS. 1C and 1D), and the retention voltage is at a minimum when the current through diode is at its minimum (trace 110 in FIGS. 1C and 1D). As the retention voltage gets smaller, the voltage difference across each SRAM cell decreases, and the likelihood of data corruption increases. The reduction in the retention voltage is exacerbated by variations in the threshold voltage of self-biasing diode 104 across PVT variations.

A circuit and method for reducing the leakage current of an SRAM array are provided that enable the retention voltage across the array to remain at approximately a constant level thereby reducing the likelihood of data corruption. The circuit includes a current limiter and a voltage regulator coupled between an SRAM array and one of the voltage supply nodes.

Figure 2A:
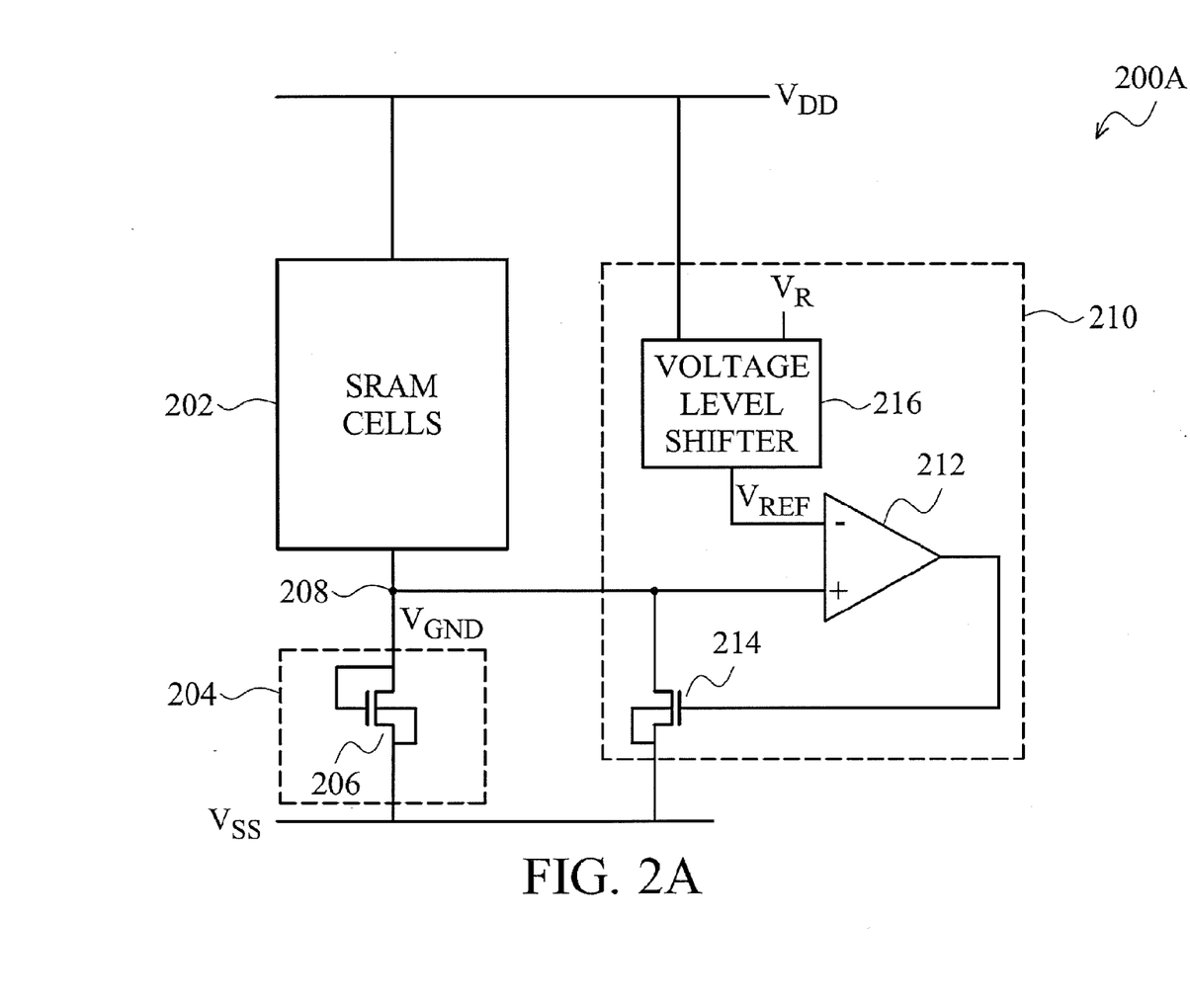
FIG. 2A is a schematic diagram of one example of an SRAM retention protection circuit.

FIG. 2A illustrates one example of a circuit 200A for reducing leakage current while providing a substantially constant retention voltage for an SRAM array 202, which may include a plurality of SRAM cells as will be understood by one skilled in the art. A current limiter 204 including a MOS transistor 206 is coupled to SRAM array 202 at node 208. Current limiter 204 is illustrated as a self-biasing diode 206, but may also be implemented as an NMOS transistor having its gate coupled to positive voltage source $V_{DD}$ or to another bias voltage, for example.

Voltage regulator 210 is also coupled to node 208 between SRAM array 202 and current limiter 204. Voltage regulator includes an operational amplifier ("op amp") 212 having its positive terminal coupled to node 208 and its negative terminal configured to receive a reference voltage, $V_{REF}$. The output of op amp 212 is coupled to a gate of NMOS transistor 214, which has its source coupled to node 208 and its drain coupled to low voltage supply $V_{SS}$. The reference voltage $V_{REF}$, which is equal to the difference between the positive supply voltage $V_{DD}$ and the target retention voltage $V_R$, may be provided to op amp 212 by a voltage level shifter 216 as illustrated in FIG. 2A, by a voltage divider, or by some other circuitry for providing a predetermined voltage level as will be understood by one skilled in the art.

Figure 3:
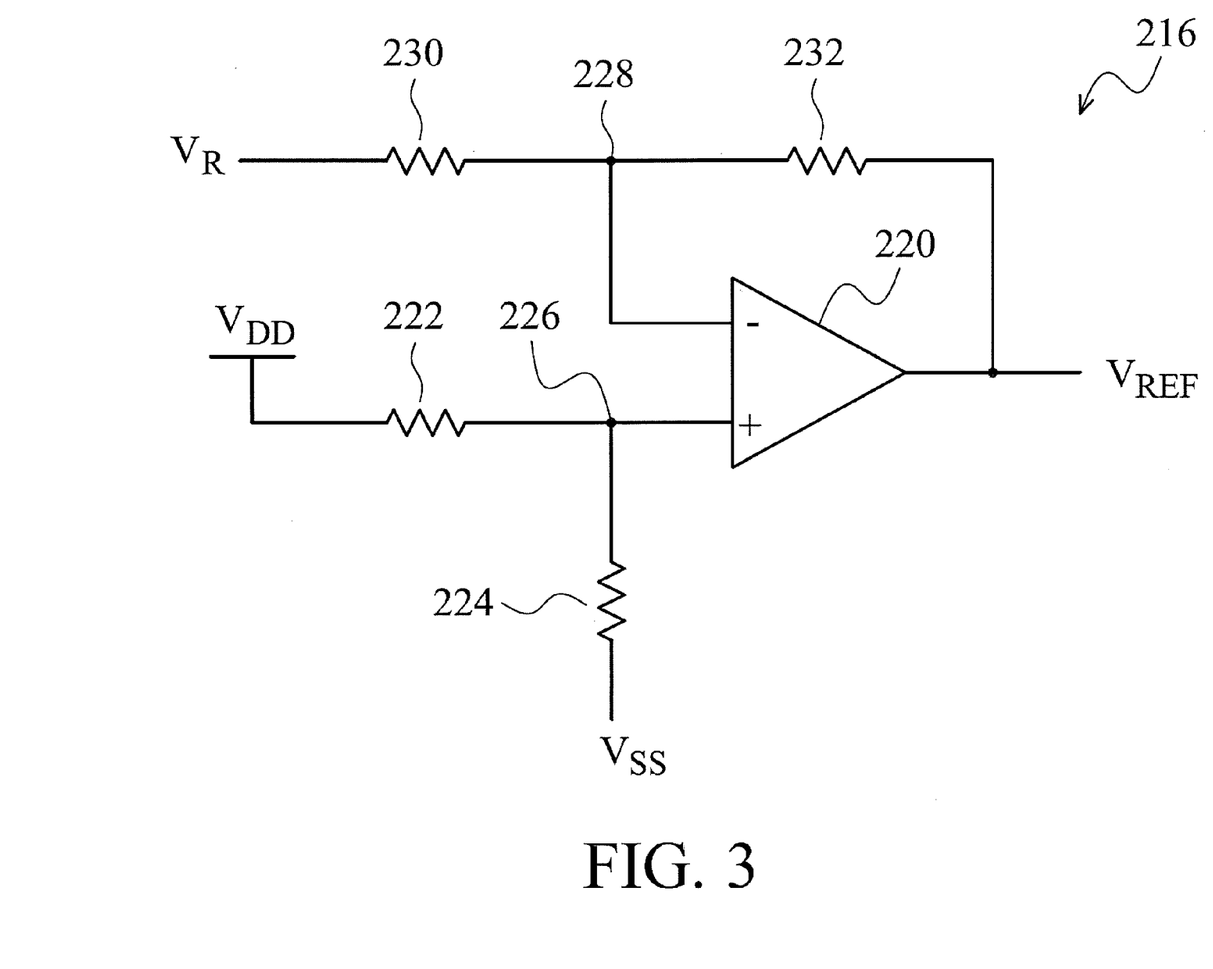
FIG. 3 is a schematic diagram of one example of a voltage level shifter in accordance with FIGS. 2A-2C.

FIG. 3 illustrates one example of a voltage level shifter 216. As shown in FIG. 3, level shifter 216 includes an op amp 220 having its positive terminal coupled to a high voltage supply node set at the positive voltage source $V_{DD}$ through resistor 222. Resistor 224 is coupled to $V_{SS}$ and to node 226, which is disposed between the positive terminal of op amp 220 and resistor 222. The negative terminal of op amp 220 is coupled to node 228, which is disposed between resistor 230 and resistor 232. Resistor 230 is coupled to a voltage source node providing the retention voltage $V_R$, and resistor 232 is coupled to the output of op amp 220. The output of op amp 220 provides the reference voltage $V_{REF}$, which is equal to the difference between $V_{DD}$ and $V_R$ (i.e., $V_{REF}=V_{DD}-V_R$), to the negative terminal of op amp 212 of voltage regulator 210. Accordingly, as the supply voltage $V_{DD}$ is increased or decreased, the reference voltage, $V_{REF}$, will also increase or decrease.

In operation, current limiter 204 limits the leakage current from SRAM array 202, which results in the voltage $V_{GND}$ at node 208 increasing thereby reducing the retention voltage across SRAM 202. Voltage regulator 210 prevents voltage $V_{GND}$ increasing above voltage $V_{REF}$ by sinking additional current from SRAM array 202 through MOS transistor 214. For example, once $V_{GND}$ increases above $V_{REF}$, op amp 212 outputs a voltage to the gate of MOS transistor 214 that turns MOS transistor 214 into an on state in which current is able to flow through MOS transistor 214. Op amp 212 also sets the driving strength of MOS transistor 214 such that node 208 is pulled up or pulled down to the predetermined level of $V_{REF}$. When the voltage $V_{GND}$ at node 208 is below the reference voltage $V_{REF}$, op amp 212 outputs a voltage to the gate of MOS transistor 214 that turns MOS transistor 214 into an off state in which current does not flow through MOS transistor 214 such that current limiter 204 handles the leakage current from SRAM array 202. In low leakage ("SS") corners, current limiter 204 handles substantially all of the leakage current from SRAM 202 in order to maximize the retention voltage, i.e., the voltage across SRAM array 202. For example, the voltage at node 208 may be equal to zero volts, and the retention voltage may equal the voltage of positive supply voltage $V_{DD}$.

Figure 4:
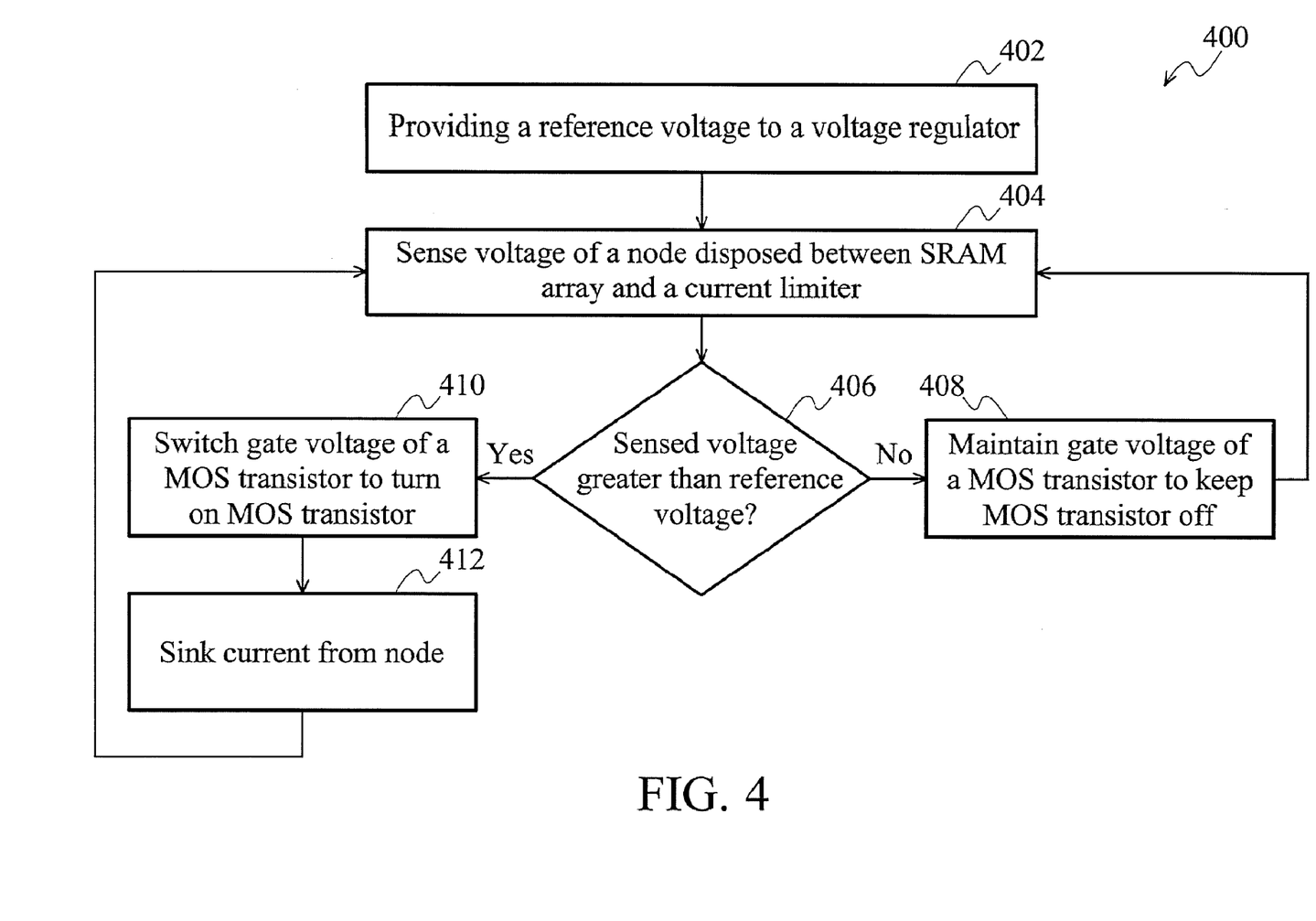
FIG. 4 is a flow chart illustrating one example of a method of operation of an SRAM retention protection circuit.

FIG. 4 is a flow chart illustrating one example of a method of operation 400 of SRAM retention protection circuit 200A. At block 402, a reference voltage is provided to a voltage regulator 210 from one of a voltage divider or a voltage level shifter 216. As described above, the reference voltage, $V_{REF}$, is selected as the difference between the operation supply voltage of the circuit 200A, $V_{DD}$, and the desired retention voltage, $V_R$, across SRAM array 202.

The voltage of a node between SRAM array 200 and a current limiter 204, i.e., the voltage at node 208 or $V_{GND}$, is sensed at block 404. The sensing of node 208 is performed by op amp 212, which receives reference voltage $V_{REF}$ at one input and the voltage at node 208 $V_{GND}$ at a second input. At block 406, the sensed voltage at node 208 is compared to the reference voltage received from the voltage divider or voltage level shifter 216 to determine if the sensed voltage is greater than the reference voltage.

If the sensed voltage is less than the reference voltage, then at block 408 the gate voltage of a MOS transistor, i.e., NMOS transistor 214 in FIG. 2A, is maintained such that the MOS transistor stays is an off condition and current limiter 204 handles substantially all the leakage current from SRAM array 202. If the sensed voltage is less than the reference voltage, then at block 410 the gate voltage of the MOS transistor is switched or adjusted such that the MOS transistor is turned into an on state. At block 412, the MOS transistor is on and assists current limiter 204 in sinking additional current from SRAM array 202. The voltage output from op amp 212 also sets the driving strength of the MOS transistor as described above.

Figure 2B:
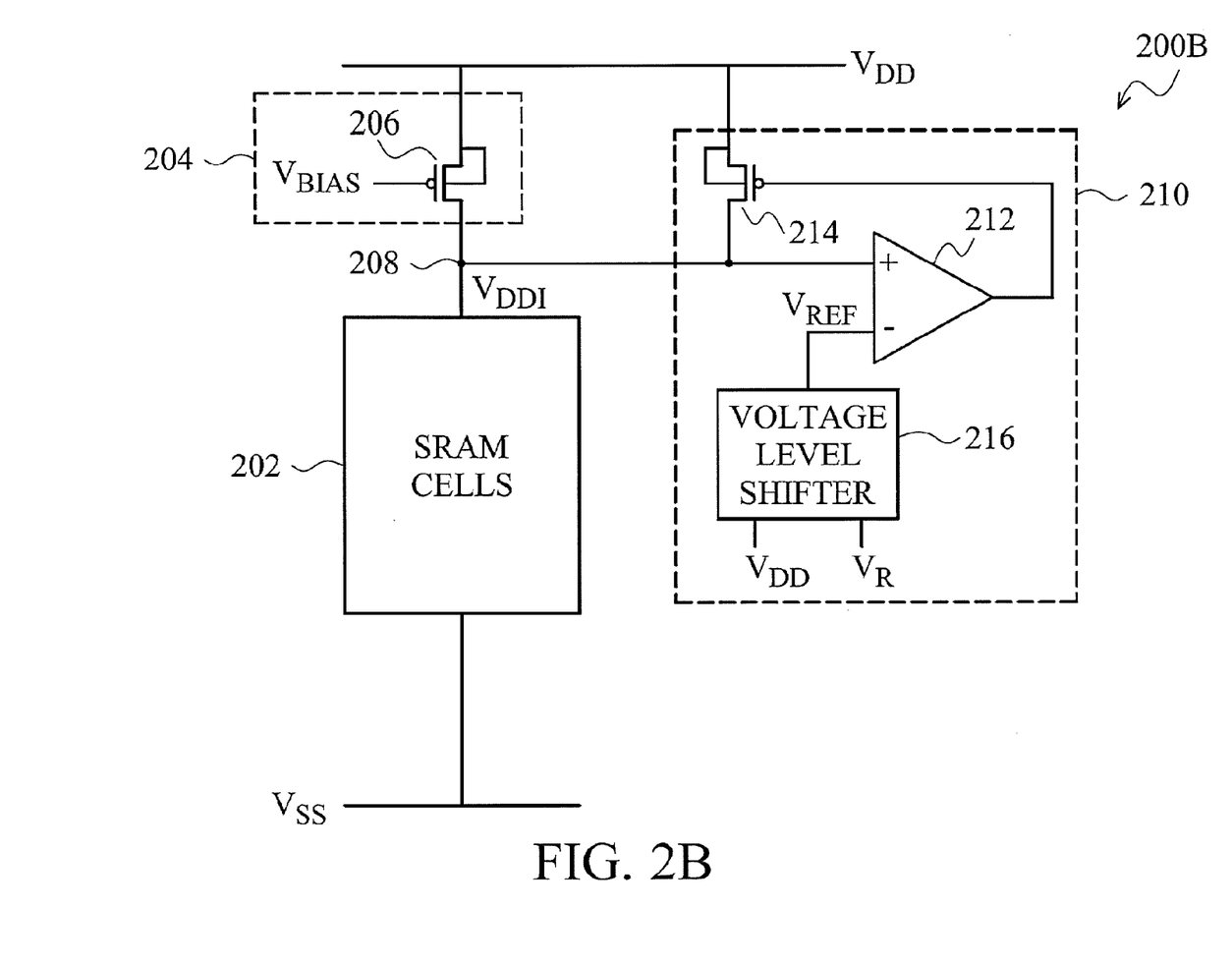
FIG. 2B is a schematic diagram of another example of an SRAM retention protection circuit.

FIG. 2B illustrates another example of an SRAM retention protection circuit 200B. As shown in FIG. 2B, current limiter 204 of circuit 200B includes MOS transistor 206, which may be a PMOS transistor having its gate coupled to a bias voltage, $V_{BIAS}$. The source of MOS transistor 206 is coupled to a positive voltage source node set at $V_{DD}$, and the drain of MOS transistor 206 is coupled to SRAM array 202 at node 208. Current limiter 204 may also be implemented as a self-biasing diode as will be understood by one skilled in the art.

Voltage regulator 210 is coupled to node 208 between SRAM array 202 and current limiter 204. Voltage regulator 210 includes an op amp 212 having its positive terminal coupled to node 208 and its negative terminal receives a reference voltage, $V_{REF}$. The output of op amp 212 is coupled to a gate of PMOS transistor 214, which has its source coupled to node 208 and its drain coupled to positive supply voltage $V_{DD}$. The reference voltage $V_{REF}$ may be provided to op amp 212 by a voltage level shifter 216 as illustrated in FIG.

2B, by a voltage divider, or by some other circuitry for providing a predetermined voltage level as will be understood by one skilled in the art. The voltage at node 208, $V_{DDI}$, is equal to the positive supply voltage $V_{DD}$ minus the voltage across current limiter 204.

The operation of circuit 200B is similar to the operation of circuit 200A described above. For example, current limiter 204 limits the leakage current of SRAM array 202, which results in the voltage across MOS transistor 206 increasing and the retention voltage across SRAM array 202 decreasing. Voltage regulator 210 prevents the voltage $V_{DDI}$ at node 208 dropping below the voltage $V_{REF}$ by turning on MOS transistor 214 to provide current from node 208 thereby maintaining the retention voltage above a predetermined level, i.e., at or above $V_R$.

Figure 2C:
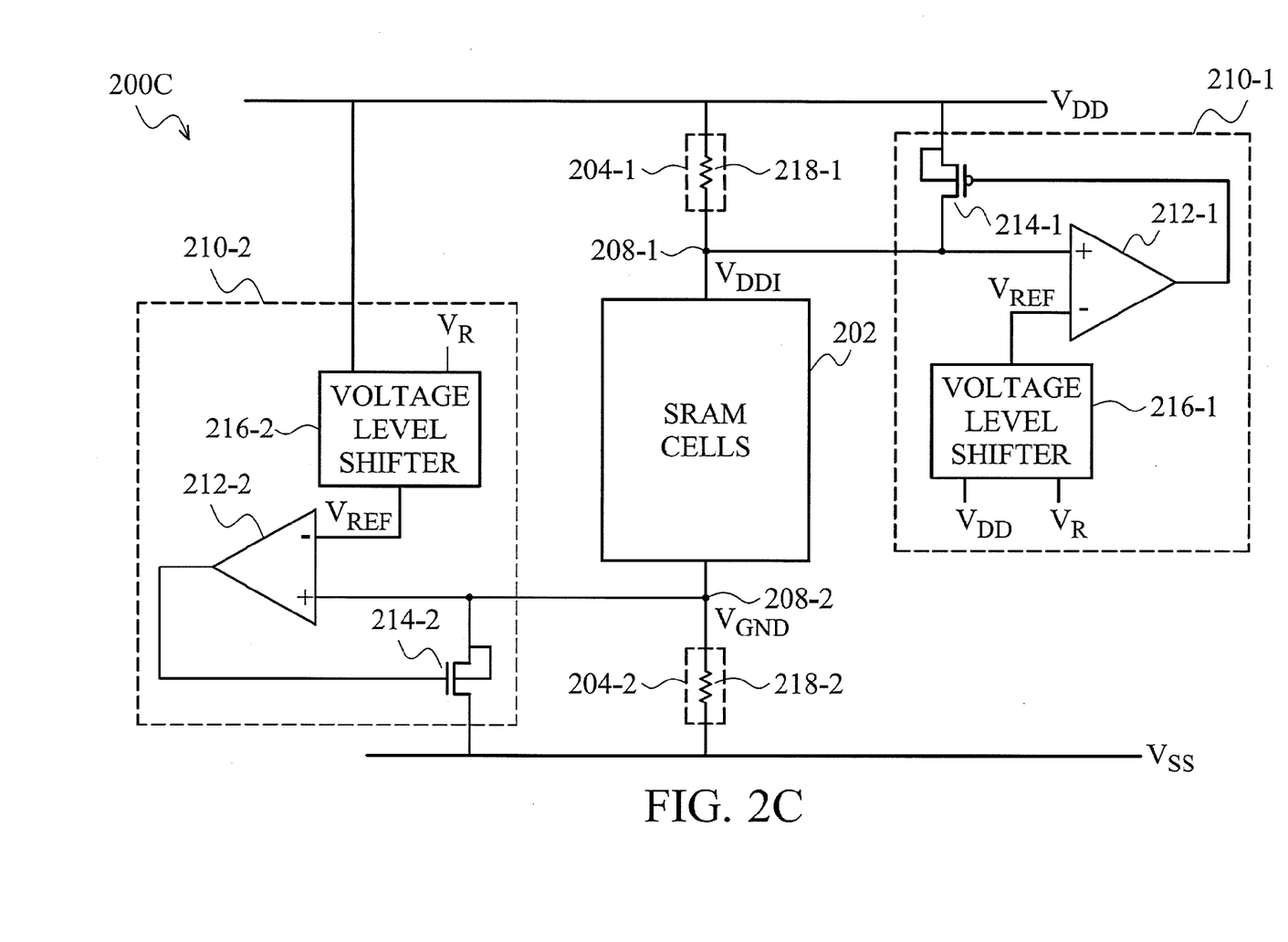
FIG. 2C is a schematic diagram of another example of an SRAM retention protection circuit.

FIG. 2C illustrates yet another example of an SRAM retention protection circuit 200C. As shown in FIG. 2C, circuit 200C includes first and second current limiters 204-1 and 204-2 each comprising a resistor 218-1 and 218-2. Current limiter 204-1 is coupled between a voltage supply rail set at $V_{DD}$ and a node 208-1 having a voltage of $V_{DDI}$, and current limiter 204-2 is coupled between voltage supply rail set at $V_{SS}$ and a node 208-2 having a voltage of $V_{GND}$.

Voltage regulator 210-1 is coupled to node 208-1 between SRAM array 202 and current limiter 204-1, and voltage regulator 210-2 is coupled to node 208-2 between SRAM array 202 and current limiter 204-2. Each voltage regulator 210-1, 210-2 includes a respective op amp 212-1, 212-2 having its positive terminal coupled to one of the nodes 208-1 and 208-2 and the negative terminal configured to receive reference voltage, $V_{REF}$, provided by a respective voltage level shifter 216-1, 216-2. The output of op amp 212-1 is coupled to the gate of PMOS transistor 214-1, which has its source coupled to node 208-1 and its drain coupled to positive supply voltage $V_{DD}$. The output of op amp 212-2 is coupled to the gate of NMOS transistor 214-2, which has its source coupled to node 208-1 and its drain coupled to low voltage supply voltage $V_{SS}$.

The operation of circuit 200C is similar to the operation of circuits 200A and 200B described above. For example, current limiter 204-1 limits the leakage current of SRAM array 202, which results in the voltage across resistor 218 increasing and the retention voltage across SRAM array 202 decreasing. Voltage regulator 210-1 prevents the voltage $V_{DDI}$ at node 208 dropping below the voltage $V_{REF}$ by turning on MOS transistor 214-1 to provide current from node 208 thereby maintaining the retention voltage above a predetermined level, i.e., at or above $V_R$. Similarly, current limiter 204-2 limits the leakage current of SRAM array 202 resulting in the voltage across resistor 218-2, i.e., $V_{GND}$, increasing. Voltage regulator 210-2 prevents the voltage $V_{GND}$ at node 208-2 from increasing about the predetermined level $V_R$ by turning on NMOS transistor 214-2 such that NMOS transistor 214-2 assists resistor 218-2 in high leakage PVT corners in order to maintain a adequate retention voltage across SRAM array 202.

Figure 5:
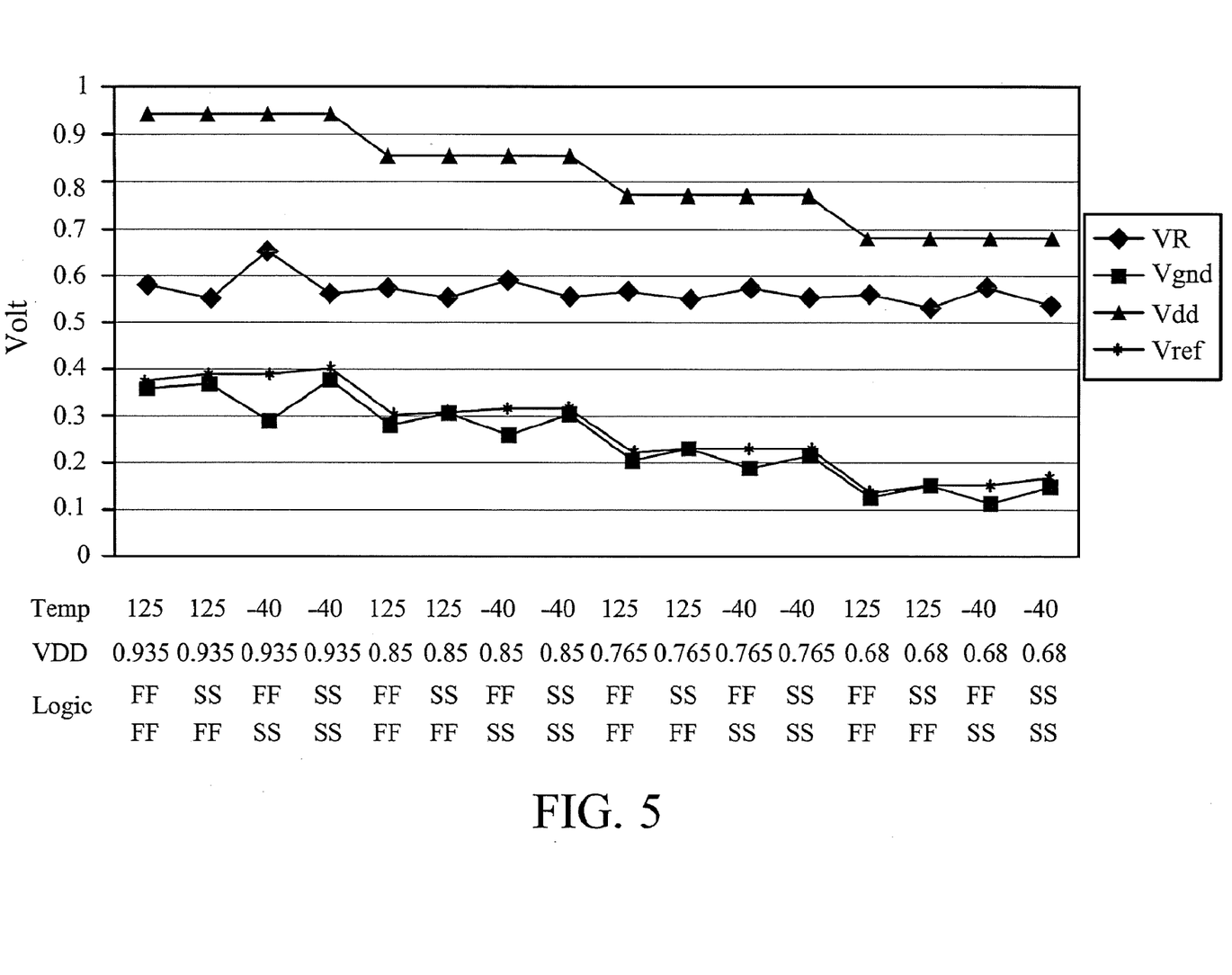
FIG. 5 is an example of a graph illustrating simulation data for the voltage across an SRAM array in accordance with FIG. 2A with varying PVT characteristics.

FIG. 5 illustrates simulation data for the voltage across SRAM array 202 in accordance with FIG. 2A with varying PVT characteristics. As shown in FIG. 5, the retention voltage, $V_R$, across SRAM array 202, which is approximately 65% of $V_{DD}$ in this example, stays substantially constant across all simulation PVT conditions.

Figure 6:
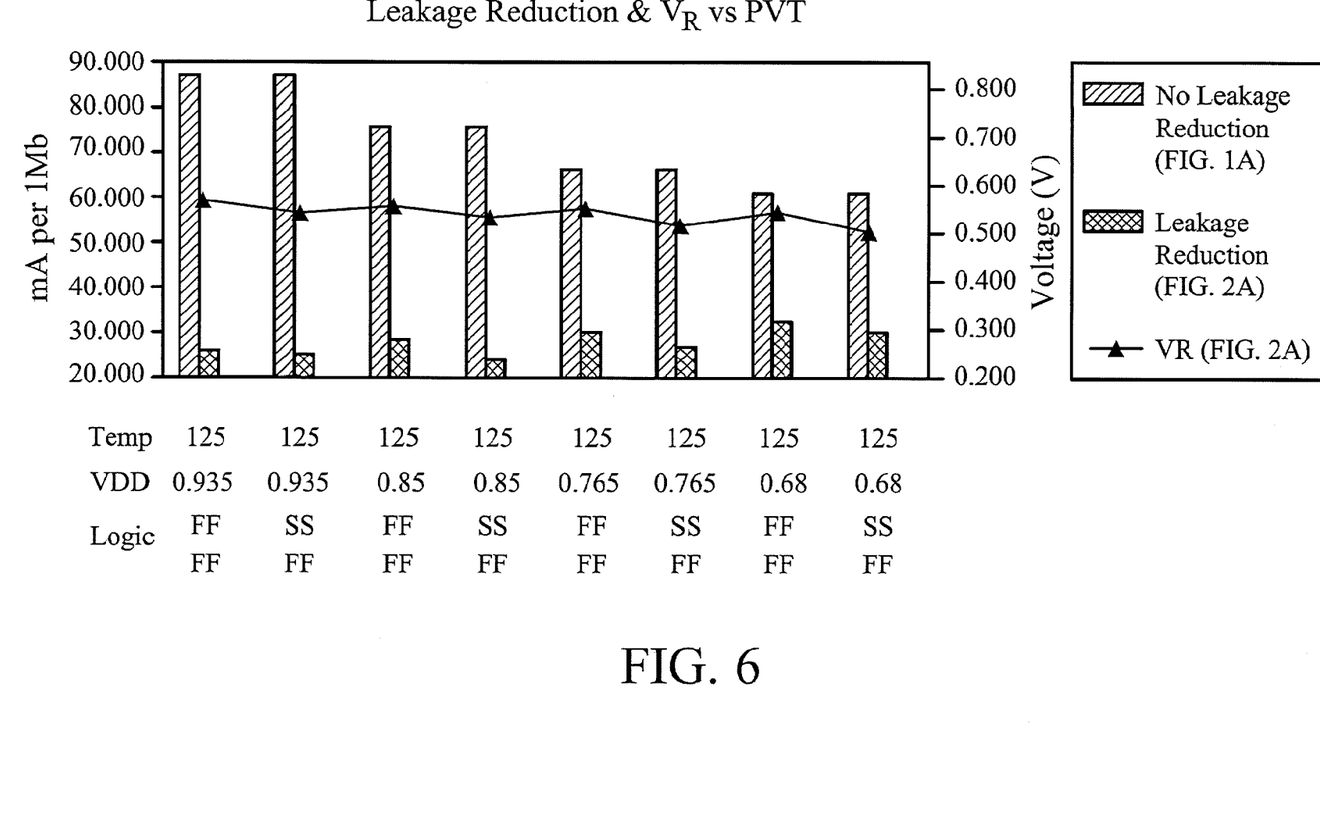
FIG. 6 is an example of a graph comparing the leakage current for an SRAM array without any leakage protection to an SRAM array including an SRAM retention protection circuit in accordance with FIG. 2A across various PVT conditions.

FIG. 6 is a graph comparing the leakage current for an SRAM array without any leakage protection to an SRAM array including an SRAM retention protection circuit 200A in accordance with FIG. 2A across various PVT conditions. As shown in FIG. 6, SRAM retention protection circuit 200A reduces the leakage current of the SRAM array by more than 70% percent for the worst PVT corner compared to an SRAM array without any leakage protection while maintaining an approximately constant retention voltage, Delta V.

Figure 7:
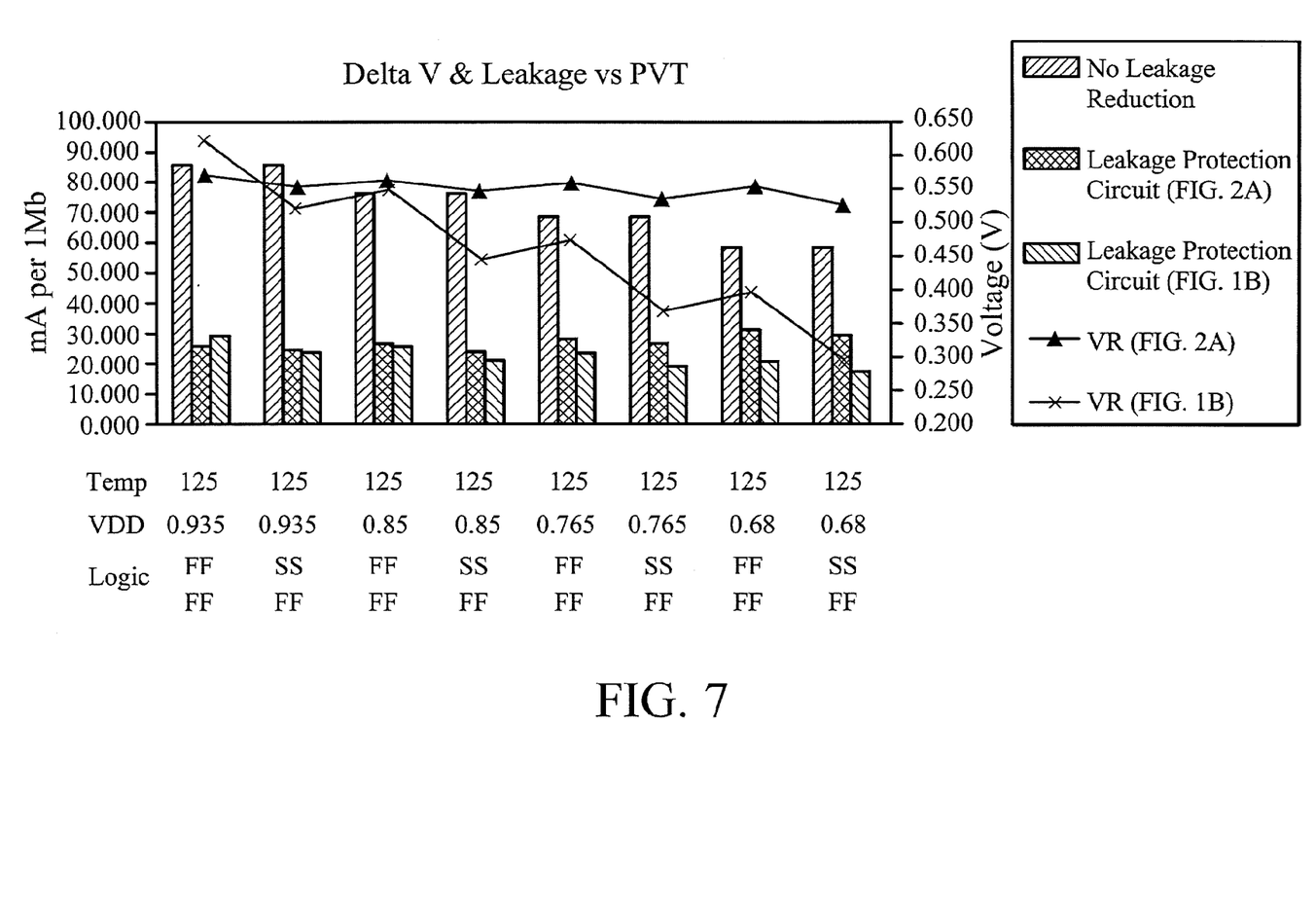
FIG. 7 is an example of a graph comparing the leakage current and retention voltage for an SRAM array not having a leakage current protection circuit, an SRAM array having a leakage current protection circuit in accordance with FIG. 1B, and an SRAM array including the SRAM retention protection circuit illustrated in FIG. 2A.

FIG. 7 is a graph comparing the leakage current and retention voltage $V_R$ for an SRAM array not having any leakage current protection, an SRAM array in accordance with FIG. 1B, and an SRAM retention protection circuit 200A illustrated in FIG. 2A. As shown in FIG. 7, the leakage current of the SRAM retention protection circuit 200A illustrated in FIG. 2A is comparable to the leakage current of the SRAM array coupled to the current limiter illustrated in FIG. 1B, which is vastly superior to an SRAM array without any leakage protection. However, the SRAM retention protection circuit 200A provides a retention voltage $V_R$ across high leakage ("FF") SRAM corners that varies by less than 0.05 volts and is substantially constant compared to the circuit illustrated in FIG. 1B that varies by over 0.3 volts across all PVT corners.

The improved SRAM retention protection circuit and method described herein advantageously maintains the retention voltage across the SRAM array above a predetermined threshold while also providing leakage protection. Consequently, the SRAM retention protection circuit and method provide greater reliability for data retention compared to conventional circuits only having leakage protection.

Although the circuit and method have been described in terms of exemplary embodiments, they are not limited thereto. Rather, the appended claims should be construed broadly, to include other variants and embodiments of the circuit and method, which may be made by those skilled in the art without departing from the scope and range of equivalents of the circuit and method.

What is claimed is:

1. An integrated circuit, comprising:
a static random access memory (SRAM) array coupled to a first voltage supply node and to a second voltage supply node, the first and second voltage supply nodes providing a retention voltage across the SRAM array;
a current limiter disposed between the SRAM array and the first voltage supply node; and
a voltage regulator coupled in parallel with the current limiter between the SRAM array and the first voltage supply node, the voltage regulator including a first operational amplifier configured to maintain the retention voltage across the SRAM array above a predetermined level based at least in part on a reference voltage received directly from an output of a second operational amplifier.

2. The integrated circuit of claim 1, wherein the first voltage supply node is set at $V_{SS}$ and the second voltage supply node is set at $V_{DD}$.

3. The integrated circuit of claim 1, wherein the first voltage supply node is set at $V_{DD}$ and the second voltage supply node is set at $V_{SS}$.

4. The integrated circuit of claim 1, wherein the current limiter includes a MOS transistor having a gate coupled to a bias voltage.

5. The integrated circuit of claim 1 wherein the first operational amplifier has a first input coupled to a node between the SRAM array and the current limiter and a second input directly coupled to the output of the second operational amplifier to receive the reference voltage, the voltage regulator further including
a MOS transistor having a source coupled to the node between the SRAM array and the current limiter, a drain coupled to the first voltage supply node, and a gate coupled to an output of the first operational amplifier, wherein the first operational amplifier provides a voltage to the gate of the MOS transistor based on a difference between a voltage at the node and the reference voltage for selectively turning on and setting a driving strength of the MOS transistor to maintain the retention voltage across the SRAM array above the predetermined level.

6. The integrated circuit of claim 5, further comprising a level shifter including the second operational amplifier for providing the voltage regulator with the reference voltage.

7. An integrated circuit, comprising:
a static random access memory (SRAM) array disposed between a first voltage supply node and a second voltage supply node, the first and second voltage supplies providing a retention voltage across the SRAM array;
a current limiter including a first MOS transistor disposed between the SRAM array and the first voltage supply node; and
a voltage regulator coupled in parallel with the current limiter between the SRAM array and the first voltage supply node, the voltage regulator including
a first operational amplifier, a second operational amplifier, and a second MOS transistor, the first operational amplifier having a first input coupled to a node between the SRAM array and the current limiter and a second input configured to receive a reference voltage, an output of the first operational amplifier coupled to the gate of the second MOS transistor, the second operational amplifier having an output directly coupled to the second input of the first operational amplifier for providing the first operational amplifier with the reference voltage,
wherein the voltage regulator applies a switching voltage to the gate of the second MOS transistor based on a difference between a voltage of the node and the reference voltage for maintaining the retention voltage across the SRAM array above a predetermined level.

8. The integrated circuit of claim 7, wherein the voltage level shifter provides the reference voltage in response to receiving a voltage equal to the voltage of the first supply node and the predetermined retention voltage level.

9. The integrated circuit of claim 7, wherein
the first voltage supply node is set at $V_{SS}$,
the second voltage supply node is set at $V_{DD}$, and
the first and second MOS transistors are NMOS transistors.

10. The integrated circuit of claim 7, wherein
the first voltage supply node is set at $V_{DD}$,
the second voltage supply node is set at $V_{SS}$, and
the first and second MOS transistors are PMOS transistors.

11. A method, comprising:
sensing a voltage of a node disposed between an SRAM array and a current limiter at a voltage regulator comprising a first operational amplifier coupled to the node;
comparing the sensed voltage to a reference voltage received at a first input of the first operational amplifier directly from an output of a second operational amplifier; and
sinking current from the node if the sensed voltage is above the reference voltage so that a retention voltage across the SRAM array is maintained above a predetermined level.

12. The method of claim 11, wherein the step of sinking current includes providing a switching voltage to a gate of a MOS transistor coupled to the node, the switching voltage applied to the gate of the MOS transistor turning the MOS transistor into an on state in which current flows between a source and a drain of the MOS transistor.

13. The method of claim 11, further comprising providing the reference voltage to the voltage regulator from the output of the second operational amplifier.

14. The method of claim 13, wherein the first operational amplifier has a second input coupled to the node.

15. The method of claim 11, wherein the current limiter includes an NMOS transistor coupled to the node and to a voltage supply node set at $V_{SS}$.

16. The method of claim 11, wherein the current limiter includes a PMOS transistor coupled to the node and to a voltage supply node set at $V_{DD}$.

17. The method of claim 11, wherein the reference voltage is based on a retention voltage for retaining data in the SRAM array.

18. The integrated circuit of claim 1, wherein
the second operational amplifier includes a first input that is coupled to the first voltage supply and a second input that is coupled to a node set at the retention voltage, and
the first voltage supply is set at $V_{DD}$ and the reference voltage is equal to a difference between $V_{DD}$ and the retention voltage.

19. The integrated circuit of claim 7, wherein
the second operational amplifier includes a first input that is coupled to the first voltage supply and a second input that is coupled to a node set at the retention voltage, and
the first voltage supply is set at $V_{DD}$ and the reference voltage is equal to a difference between $V_{DD}$ and the retention voltage.

* * * * *